United States Patent
Kudo

[19]

[11] Patent Number: 6,046,639
[45] Date of Patent: Apr. 4, 2000

[54] AMPLIFIER/OSCILLATOR CIRCUIT WITH COMMON-EMITTER AMPLIFIER AND DIFFERENTIAL AMPLIFIER

[75] Inventor: Hiroshi Kudo, Tokyo, Japan

[73] Assignee: NEC Corporation, Tokyo, Japan

[21] Appl. No.: 09/148,479

[22] Filed: Sep. 8, 1998

[30] Foreign Application Priority Data

Sep. 5, 1997 [JP] Japan .................................. 9-257600

[51] Int. Cl.$^7$ ...................................................... H03F 3/45
[52] U.S. Cl. ........................................... 330/252; 330/311
[58] Field of Search ..................................... 330/252, 311

[56] References Cited

U.S. PATENT DOCUMENTS

| 5,399,988 | 3/1995 | Knierim | 330/149 |
| 5,479,137 | 12/1995 | Harford | 331/117 R |

FOREIGN PATENT DOCUMENTS

| 2-36213 | 3/1990 | Japan . |
| 2-179105 | 7/1990 | Japan . |
| 2-192305 | 7/1990 | Japan . |
| 3-35605 | 2/1991 | Japan . |
| 4-170806 | 6/1992 | Japan . |
| 5-39020 | 5/1993 | Japan . |
| 8-340216 | 12/1996 | Japan . |

OTHER PUBLICATIONS

Tamotsu Inaba, "Mastering Oscillator Circuits", Nihon Hoso Kyokai (NHK), Sep. 20, 1988, p. 153.
Saburo Chiba, "Highly Stable Crystal Oscillator Circuit with Negative Feedback from the Collector", *Japan Journal of Electronic Information and Communication Institute*, vol. J73, C–II, No. 3, Mar. 1990, pp. 143–153.
Design Techniques of Semiconductor Circuits, published by Nikkei McGraw–Hill Publishing Co., Ltd., pp. 247–250.

*Primary Examiner*—Robert Pascal
*Assistant Examiner*—Henry Choe
*Attorney, Agent, or Firm*—Sughrue, Mion, Zinn Macpeak & Seas, PLLC

[57] ABSTRACT

An amplifier/oscillator circuit is provided, which makes it possible to interconnect a differential amplifier with a common-emitter amplifier without any coupling capacitor. This amplifier circuit is comprised of (a) a common-emitter amplifier including a first bipolar transistor; (b) a first level converter for converting a dc level of the first output signal to a first dc level; (c) a second level converter for converting a dc level of the second output signal to a second dc level; and (d) a differential amplifier including first and second input terminals and first and second output terminals. An input signal is applied to abase of the first bipolar transistor, thereby producing first and second output signals. The first and second output signals of the common-emitter amplifier are derived from the base and collectors of the first bipolar transistor, respectively. Dc levels at the first and second input terminals of the differential amplifier are equal to the first and second dc levels, respectively. The first and second output signals of the common-emitter amplifier are applied to the first and second input terminals of the differential amplifier through the first and second level converters, thereby producing first and second output signals at the first and second output terminals, respectively.

16 Claims, 9 Drawing Sheets

AMPLIFIER/OSCILLATOR CIRCUIT WITH COMMON-EMITTER AMPLIFIER AND DIFFERENTIAL AMPLIFIER

BACKGROUND OF THE INVENTION

1. Field of the Invention

The present invention relates to an amplifier/oscillator circuit and more particularly, to an amplifier/oscillator circuit including a common-emitter amplifier and a differential amplifier interconnected with each other without using any coupling capacitor, which is applicable to a reference oscillator for a Phase-Locked Loop (PLL) circuit.

2. Description of the Prior Art

Conventionally, to constitute an oscillator circuit using a crystal-controlled oscillator (i.e., a crystal oscillator) and an amplifier, it has been popular to connect the crystal oscillator to the amplifier through a coupling capacitor. This is because the bias voltage of the crystal oscillator at the output terminal(s) is different from the bias voltage of the amplifier at the input terminal(s). Due to the behavior of this coupling capacitor, the ac (or, signal) component of the output signal of the crystal oscillator is able to be transmitted to the amplifier while preventing the bad effects caused by the different bias voltages.

Various oscillator circuits using the coupling capacitor have been well known. Some examples are disclosed in (a) a book written by Tamotsu Inaba, entitled "Mastering Oscillator Circuits", FIGS. 7–16 on pp. 153, published in Sep. 20, 1988 from Nihon Hoso Kyokai (NHK), (b) FIG. 2 of the Japanese Non-Examined Utility-Model Publication No. 2-36213 published in 1990, and (c) FIGS. 1 and 2 of the Japanese Non-Examined Patent Publication No. 8-340216 published in 1996.

A typical example of the conventional oscillator circuits is shown in FIG. 1. This oscillator circuit 55 is comprised of a crystal oscillator 51 located at a first stage, a first differential amplifier 53 located at a second stage, and a second differential amplifier 54 located at a third stage.

The crystal oscillator 51 includes a common-emitter amplifier 51a, a crystal $X_{tal}$, and two capacitors $C_{51}$ and $C_{52}$.

The common-emitter amplifier 51a has an npn-type bipolar transistor Q51, a feedback resistor $R_{f5}$, and a load resistor R51. An emitter of the transistor Q51 is directly connected to the ground. A base of the transistor Q51 is directly connected to an input terminal T51. A collector of the transistor Q51 is connected through the load resistor R51 to a power supply line applied with a power supply voltage $V_{CC}$. The base and collector of the transistor Q51 are coupled together through the feedback resistor $R_{f5}$. The collector of the transistor Q51 is directly connected to another input terminal T52.

A terminal of the crystal $X_{tal}$ is connected to the ground through the capacitor $C_{51}$. Another terminal of the crystal $X_{tal}$ is connected to the ground through the capacitor $C_{52}$. These two terminals of the crystal $X_{tal}$ are connected to the input terminals T51 and T52, respectively. Thus, the two terminals of the crystal $X_{tal}$ are connected to the base and collector of the transistor Q51 through the input terminals T51 and T52, respectively.

The first differential amplifier 53, which serves as a buffer amplifier, has a pair of emitter-coupled npn-type bipolar transistors Q52 and Q53, a constant current sink 61 sinking a constant current $I_{OS1}$ for driving the pair, two base resistors R52 and R55, and two load resistors R53 and R54. The coupled emitters of the transistors Q52 and Q53 are connected to the ground through the constant current sink 61. The collectors of the transistors Q52 and Q53 are connected to the power supply line of $V_{CC}$ through the load resistors R53 and R54, respectively. Bases of the transistors Q52 and Q53 are connected to the power supply line of $V_{CC}$ through the base resistors R52 and R55, respectively.

The bases of the transistors Q52 and Q53 serve as input terminals of the first differential amplifier 53. The collectors of the transistors Q52 and Q53 serve as output terminals of the amplifier 53.

The base of the transistor Q52 (i.e., one of the input terminals) of the first differential amplifier 53 is further connected to the base of the transistor Q51 (i.e., the output terminal of the oscillator 51) of the common-emitter amplifier 51a through a coupling capacitor $C_{C51}$.

The second differential amplifier 54 has a pair of emitter-coupled npn-type bipolar transistors Q54 and Q55, a constant current sink 62 sinking a constant current $I_{OS2}$ for driving the pair, and two load resistors R56 and R57. The coupled emitters of the transistors Q54 and Q55 are connected to the ground through the constant current sink 62. The collectors of the transistors Q54 and Q55 are connected to the power supply line of $V_{CC}$ through the load resistors R56 and R57, respectively. The collectors of the transistors Q54 and Q55 are further connected to output terminals T53 and T54, respectively. Bases of the transistors Q54 and Q55 are connected to the collectors of the transistors Q53 and Q52, respectively.

The bases of the transistors Q54 and Q55 serve as input terminals of the second differential amplifier 54. The collectors of the transistors Q54 and Q55 serve as output terminals of the amplifier 54 or the oscillator circuit 55.

The first and second differential amplifiers 53 and 54 are formed on an IC (not shown) having the input terminals T51 and T52 and the output terminals T53 and T54. The crystal $X_{tal}$ and the two capacitors $C_{51}$ and $C_{52}$ are produced as a unit, and located outside the IC. The unit including the crystal $X_{tal}$ and the capacitors $C_{51}$ and $C_{52}$ is connected to the IC through the input terminals T51 and T52.

The conventional oscillator circuit 55 shown in FIG. 1 operates in the following way.

The crystal oscillator 51 is an oscillator with the negative-feedback configuration using the feedback resistor $R_{f5}$. An output signal of the crystal oscillator 51, which has a fixed frequency defined by the crystal $X_{tal}$, is produced at the base of the transistor Q51.

The output signal of the crystal oscillator 51 is applied to the base of the transistor Q52 of the first differential amplifier 53 through the coupling capacitor $C_{C51}$ while preventing the dc bias applied to the crystal oscillator 51 from being transmitted to the first differential amplifier 53. Two output signals of the first differential amplifier 53, which are proportional to the difference between the applied output signal of the crystal oscillator 51 and the voltage applied to the base of the transistor Q53, are produced at the collectors of the transistors Q52 and Q53.

The two output signals of the first differential amplifier 53 are directly applied to the bases of the transistors Q55 and Q54 of the second differential amplifier 54, respectively. Two output signals of the second differential amplifier 54, which are proportional to the difference between the two output signals of the first differential amplifier 53, are produced at the collectors of the transistors Q54 and Q55, i.e., the output terminals T53 and T54.

Thus, the two output signals of the conventional oscillator circuit 55 shown in FIG. 1, which have the fixed frequency defined by the crystal $X_{tal}$, are derived at the output terminals T53 and T54.

Another example of the conventional oscillator circuits is shown in FIG. 2. This oscillator circuit 55' has the same configuration as that of the oscillator circuit 55 shown in FIG. 1 except that the common-emitter amplifier 51a of the crystal oscillator 51 is replaced with a common-emitter amplifier 51a'. Therefore, the explanation about the same configuration and operation are omitted here by attaching the same reference symbols as those in the circuit 55 to the same elements in FIG. 2 for the sake of simplification of description.

In the common-emitter amplifier 51a', as clearly seen from FIG. 2, the collector (rather than the base) of the bipolar transistor Q51 is connected to the corresponding terminal of the coupling capacitor $C_{C51}$, which is unlike the circuit 55 in FIG. 1.

Still another example of the conventional oscillator circuits is shown in FIG. 3. This oscillator circuit 75 has the same configuration as that of the circuit 55 shown in FIG. 1 except that the first differential amplifier 53 is replaced with a differential amplifier 73.

In the differential amplifier 73, as clearly seen from FIG. 3, the combination of a base resistor R71 and a constant current sink 71 sinking a constant current $I_{O71}$ is provided between the coupling capacitor $C_{C51}$ and the base of the transistor Q52 and at the same time, the combination of a base resistor R72 and a constant current sink 72 sinking a constant current $I_{O72}$ is provided to the base of the transistor Q53.

The base of the transistor Q52 is connected to the power supply line of $V_{CC}$ through the base resistor R71 and connected to the ground through the constant current sink 71. The corresponding terminal of the coupling capacitor $C_{C51}$ is connected to the connection point of the base resistor R71 and the constant current sink 71. The base of the transistor Q53 is connected to the power supply line of $V_{CC}$ through the base resistor R72 and connected to the ground through the constant current sink 72.

A further example of the conventional oscillator circuits is shown in FIG. 4. This circuit 75' has the same configuration as that of the circuit 75 shown in FIG. 3 except that the crystal oscillator 51 is replaced with the crystal oscillator 51' shown in FIG. 2.

With the conventional oscillator circuits 55, 55', 75, and 75' shown in FIGS. 1 to 4, the coupling capacitor $C_{C51}$ is used to interconnect the first-stage crystal oscillator 51 with the second-stage differential amplifier 53. When any one of the conventional oscillator circuits 55, 55', 75, and 75' is formed on an IC except for the crystal $X_{tal}$ and its relating capacitors $C_{51}$ and $C_{52}$, the coupling capacitor $C_{C51}$ has a disadvantage that it occupies a large chip area of the IC. This disadvantage causes a first problem that the chip size and consequently the cost of the IC are increased.

Also, when any one of the conventional oscillator circuits 55, 55', 75, and 75' except for the crystal $X_{tal}$ and its relating capacitors $C_{51}$ and $C_{52}$ is subjected to various inspection tests to inspect the circuit operation, the oscillator circuit 55, 55', 75, or 75' needs to be operated at the practical operating frequency. Therefore, if the practical operating frequency is high, there arises a possibility that the tests cannot be carried out by using an existing IC tester or the like. This is due to the fact that the coupling capacitor $C_{C51}$ tends to induce bad effects into the tests at such high operating frequency.

To cope with this case, a proper high-frequency generator is required to be provided. However, this creates a second problem that the procedures of the inspection tests are increased and the cost of these tests are raised.

Moreover, since the coupling capacitor $C_{C51}$ tends to restrict the range of the operating frequency, there is a third problem that the applicable frequency is restricted. This third problem will limit the oscillation signal of the oscillator 51 or 51' or an external clock signal applied to the common-emitter amplifier 51a or 51a' through the input terminals T51 and T52.

SUMMARY OF THE INVENTION

Accordingly, an object of the present invention to provide an amplifier/oscillator circuit that makes it possible to interconnect a differential amplifier with a common-emitter amplifier without any coupling capacitor.

Another object of the present invention to provide an amplifier/oscillator circuit that decreases the fabrication cost of an IC on which the amplifier/oscillator circuit is formed.

Still another object of the present invention to provide an amplifier/oscillator circuit in which inspection tests can be carried out at a frequency lower than the operating frequency of the amplifier/oscillator circuit.

A further object of the present invention to provide an amplifier/oscillator circuit that expands the operable frequency range.

The above objects together with others not specifically mentioned will become clear to those skilled in the art from the following description.

According to a first aspect of the present invention, an amplifier circuit is provided, which is comprised of (a) a common-emitter amplifier including a first bipolar transistor; (b) a first level converter for converting a dc level of a first output signal of the common-emitter amplifier to a first dc level; (c) a second level converter for converting a dc level of a second output signal of the common-emitter amplifier to a second dc level; and (d) a differential amplifier including first and second input terminals and first and second output terminals.

An input signal is applied to a base of the first bipolar transistor, thereby producing the first and second output signals. The first output signal of the common-emitter amplifier is derived from the base of the first bipolar transistor. The second output signal of the common-emitter amplifier is derived from a collector of the first bipolar transistor.

A dc level at the first input terminal of the differential amplifier is equal to the first dc level. A dc level of the second input terminal of the differential amplifier is equal to the second dc level.

The first output signal of the common-emitter amplifier is applied to the first input terminal of the differential amplifier through the first level converter, thereby producing a first output signal of the differential amplifier at the first output terminal The second output signal of the common-emitter amplifier is applied to the second input terminal of the differential amplifier through the second level converter, thereby producing a second output signal of the differential amplifier at the second output terminal.

With the amplifier circuit according to the first aspect of the present invention, the first output signal of the common-emitter amplifier is applied to the first input terminal of the differential amplifier through the first level converter while equalizing the dc level of the first output signal of the common-emitter amplifier to the first dc level at the first input terminal of the differential amplifier. Similarly, the second output signal of the common-emitter amplifier is applied to the second input terminal of the differential amplifier through the second level converter while equalizing the dc level of the second output signal of the common-emitter amplifier to the second dc level at the second input terminal of the differential amplifier.

Thus, the common-emitter amplifier is able to be interconnected with the differential amplifier through the first and second level converters without any coupling capacitor.

Therefore, when the amplifier circuit according to the first aspect of the present invention is formed on an IC, this amplifier circuit does not occupy a large chip size of the IC. As a result, the fabrication cost of the IC is decreased.

Further, due to absence of the coupling capacitor, the frequency of inspection tests and the operable frequency are not restricted by the coupling capacitor. Accordingly, the inspection tests can be carried out at a frequency lower than the operating frequency of the amplifier circuit according to the first aspect of the present invention, and at the same time, the operable frequency range can be expanded.

In a preferred embodiment of the amplifier circuit according to the first aspect, the first bipolar transistor has a feedback resistor connected to the base and collector of the first bipolar transistor, thereby forming a self-biasing configuration. A current flowing through the first bipolar transistor and a current flowing through the first level converter have a relationship approximately equal to a relationship between a reference current and an output current in the Widlar current source circuit.

In this case, there is an additional advantage that the current flowing through the first level converter can be readily restricted at a low level.

In another preferred embodiment of the amplifier circuit according to the first aspect, the second level converter has a second bipolar transistor. Also, a current flowing through the second bipolar transistor is dependent upon a difference between the dc level of the second output signal of the common-emitter amplifier and a base-to-emitter voltage of the second transistor.

In this case, there is an additional advantage that the current flowing through the second level converter can be readily restricted at a low level.

In still another preferred embodiment of the amplifier circuit according to the first aspect, the common-emitter amplifier includes a constant current source/sink connected to the collector of the first transistor as an active load.

In this case, there is an additional advantage that an obtainable gain of the common-emitter amplifier is higher than the case where a load resistor is used, and that the saturation current of the first bipolar transistor is controllable.

In a further preferred embodiment of the amplifier circuit according to the first aspect, the second level converter has a resistor for adjusting an amplitude difference between the first and second output signals of the common-emitter amplifier.

In this case, there is an additional advantage that the amplitude difference between the first and second output signals of the common-emitter amplifier can be readily adjusted.

In a still further preferred embodiment of the amplifier circuit according to the first aspect, the first level converter includes a second bipolar transistor and a first load resistor and a first emitter resistor, and the second level converter includes a third bipolar transistor and a second load resistor and a second emitter resistor.

The first load resistor is connected to a collector of the second bipolar transistor and the first emitter resistor is connected to an emitter of the second bipolar transistor. A base of the second bipolar transistor is connected to the base of the first bipolar transistor of the common-emitter amplifier.

The second load resistor is connected to a collector of the third bipolar transistor and the second emitter resistor is connected to an emitter of the third bipolar transistor. A collector of the third bipolar transistor is connected to the collector of the first bipolar transistor of the common-emitter amplifier.

In this case, there is an additional advantage that the first dc level is readily set by the first load resistor and the first emitter resistor, and the second dc level is readily set by the second load resistor and the second emitter resistor.

In this preferred embodiment, it is preferred that the collector of the first bipolar transistor is connected to the base of the third transistor through a resistor for adjusting an amplitude difference between the first and second output signals of the common-emitter amplifier.

In the amplifier circuit according to the first aspect of the present invention, any signal maybe used as the input signal applied to the base of the first bipolar transistor. For example, not only any repetitive signal such as an oscillation signal and a clock signal but also any non-repetitive signal such as a data or control signal may be used.

According to a second aspect of the present invention, an oscillator circuit is provided, which is comprised of (a) an oscillator for generating a first repetitive signal with an oscillation frequency and a second repetitive signal with a same oscillation frequency as the first repetitive signal; (b) a first level converter for converting a dc level of the first repetitive signal of the oscillator to a first dc level; (c) a second level converter for converting a dc level of the second repetitive signal of the oscillator to a second dc level; and (d) a differential amplifier including first and second input terminals and first and second output terminals.

The oscillator includes a common-emitter amplifier equipped with a first bipolar transistor. The first repetitive signal of the oscillator is derived from a base of the first bipolar transistor. The second repetitive signal of the oscillator is derived from a collector of the first bipolar transistor.

A dc level at the first input terminal of the differential amplifier is equal to the first dc level. A dc level of the second input terminal of the differential amplifier is equal to the second dc level.

The first repetitive signal of the oscillator is applied to the first input terminal of the differential amplifier through the first level converter, thereby producing a first output signal of the differential amplifier at the first output terminal.

The second repetitive signal of the oscillator is applied to the second input terminal of the differential amplifier through the second level converter, thereby producing a second output signal of the differential amplifier at the second output terminal.

As seen from above, the oscillator circuit according to the second aspect of the present invention has a configuration obtained by replacing the common-emitter amplifier of the amplifier circuit according to the first aspect of the present invention with the oscillator. Moreover, the oscillator of the oscillator circuit according to the second aspect includes the common-emitter amplifier included in the amplifier circuit according to the first aspect.

Therefore, the oscillator circuit according to the second aspect has substantially the same advantages as those in the amplifier circuit according to the first aspect.

Specifically, the differential amplifier is able to be interconnected with the oscillator without any coupling capacitor. Also, the fabrication cost of an IC on which the oscillator circuit according to the second aspect of the present invention is formed is decreased. Further, inspection tests can be carried out at a frequency lower than the operating frequency of the oscillator circuit, and at the same time, the operable frequency range can be expanded.

In a preferred embodiment of the oscillator circuit according to the second aspect, the first bipolar transistor has a feedback resistor connected to the base and collector of the first bipolar transistor, thereby forming a self-biasing configuration. A current flowing through the first bipolar transistor and a current flowing through the first level converter have a relationship approximately equal to a relationship between a reference current and an output current in the Widlar current source circuit.

In this case, there is an additional advantage that the current flowing through the first level converter can be readily restricted at a low level.

In another preferred embodiment of the oscillator circuit according to the second aspect, the second level converter has a second bipolar transistor. Also, a current flowing through the second bipolar transistor is dependent upon a difference between the dc level of the second output signal of the common-emitter amplifier and a base-to-emitter voltage of the second transistor.

In this case, there is an additional advantage that the current flowing through the second level converter can be readily restricted at a low level.

In still another preferred embodiment of the oscillator circuit according to the second aspect, the common-emitter amplifier of the oscillator includes a constant current source/sink connected to the collector of the first transistor as an active load.

In this case, there is an additional advantage that an obtainable gain of the common-emitter amplifier is higher than the case where a load resistor is used, and that the saturation current of the first bipolar transistor is controllable.

In a further preferred embodiment of the oscillator circuit according to the second aspect, the second level converter has a resistor for adjusting an amplitude difference between the first and second output signals of the common-emitter amplifier of the oscillator.

In this case, there is an additional advantage that the amplitude difference between the first and second output signals of the common-emitter amplifier can be readily adjusted.

In a still further preferred embodiment of the oscillator circuit according to the second aspect, the first level converter includes a second bipolar transistor and a first load resistor and a first emitter resistor, and the second level converter includes a third bipolar transistor and a second load resistor and a second emitter resistor.

The first load resistor is connected to a collector of the second bipolar transistor and the first emitter resistor is connected to an emitter of the second bipolar transistor. A base of the second bipolar transistor is connected to the base of the first bipolar transistor of the common-emitter amplifier.

The second load resistor is connected to a collector of the third bipolar transistor and the second emitter resistor is connected to an emitter of the third bipolar transistor. A collector of the third bipolar transistor is connected to the collector of the first bipolar transistor of the common-emitter amplifier.

In this case, there is an additional advantage that the first dc level is readily set by the first load resistor and the first emitter resistor, and the second dc level is readily set by the second load resistor and the second emitter resistor.

In this preferred embodiment, it is preferred that the collector of the first bipolar transistor is connected to the base of the third transistor through a resistor for adjusting an amplitude difference between the first and second output signals of the common-emitter amplifier.

In the oscillator circuit according to the second aspect of the present invention, the oscillator may have any configuration. For example, it is needless to say that a crystal oscillator may be used as the oscillator. However, any other oscillator configuration may be used.

In the amplifier circuit according to the first aspect and the oscillator circuit according to the second aspect, the differential amplifier may have any configuration. For example, the differential amplifier may be formed by bipolar transistors and/or Metal-Oxide-Semiconductor Field-Effect Transistors (MOSFETs).

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
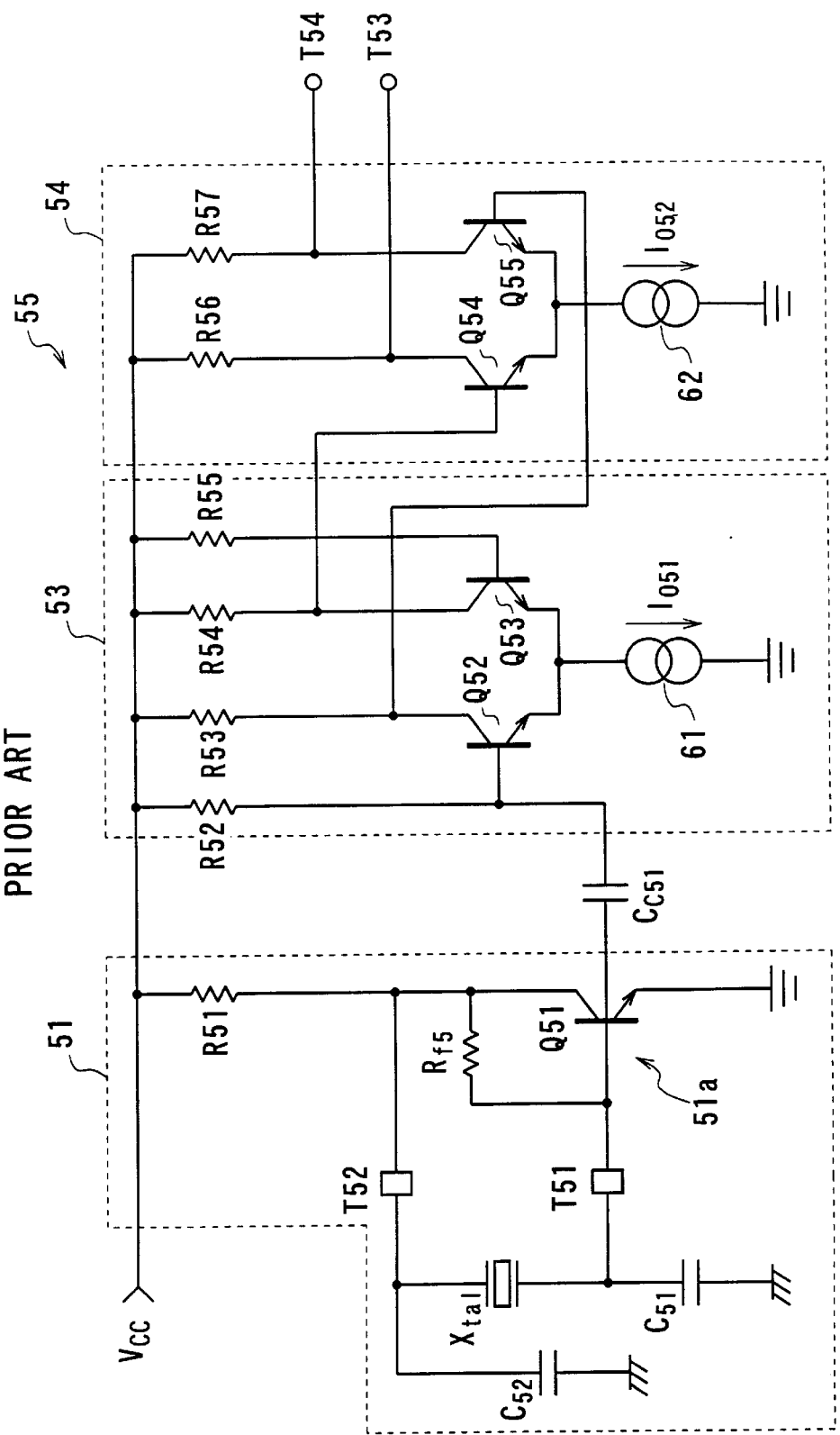
FIG. 1 is a circuit diagram showing a first example of the conventional oscillator circuits.
Figure 2:
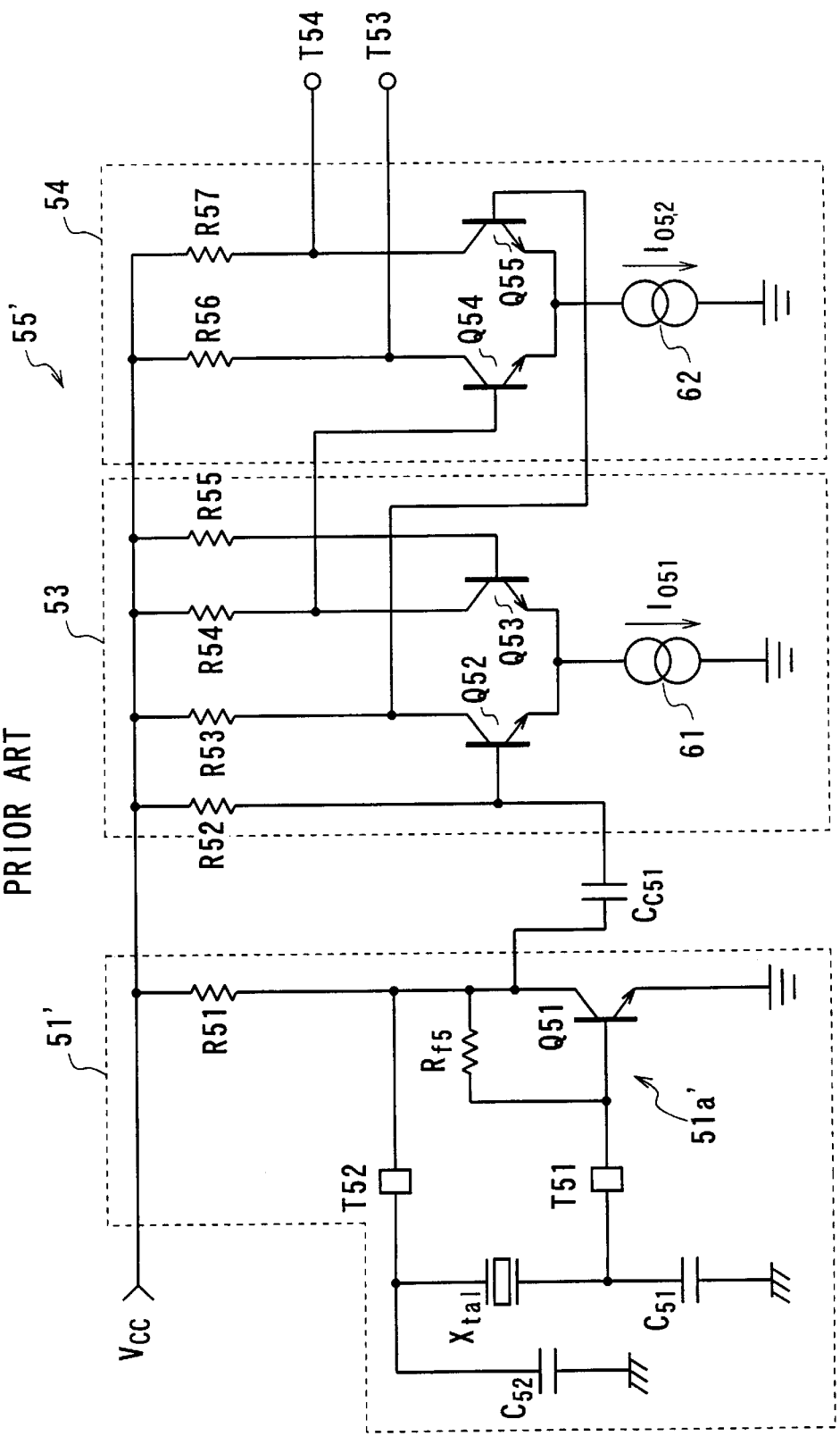
FIG. 2 is a circuit diagram showing a second example of the conventional oscillator circuits.
Figure 3:
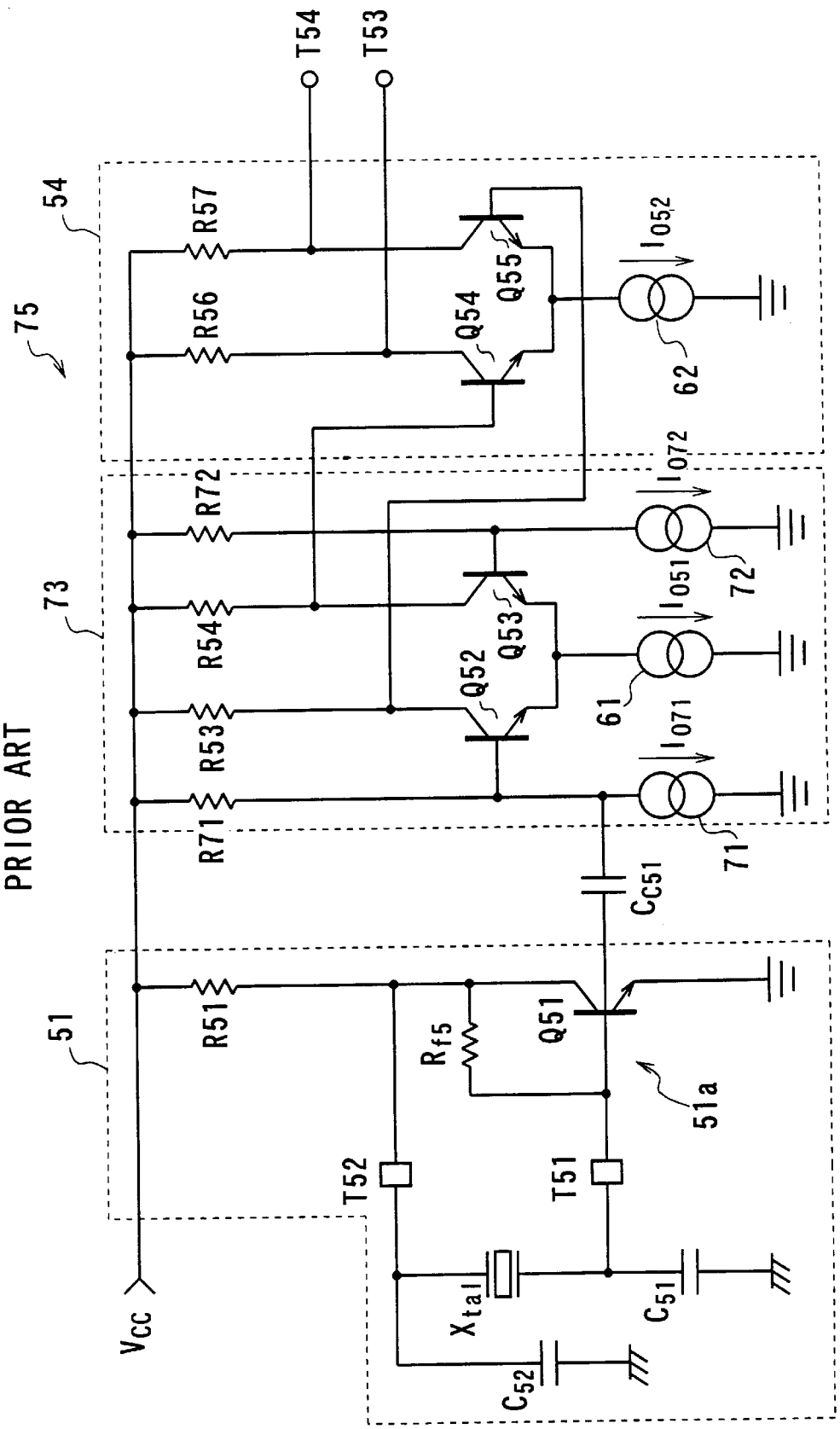
FIG. 3 is a circuit diagram showing a third example of the conventional oscillator circuits.
Figure 4:
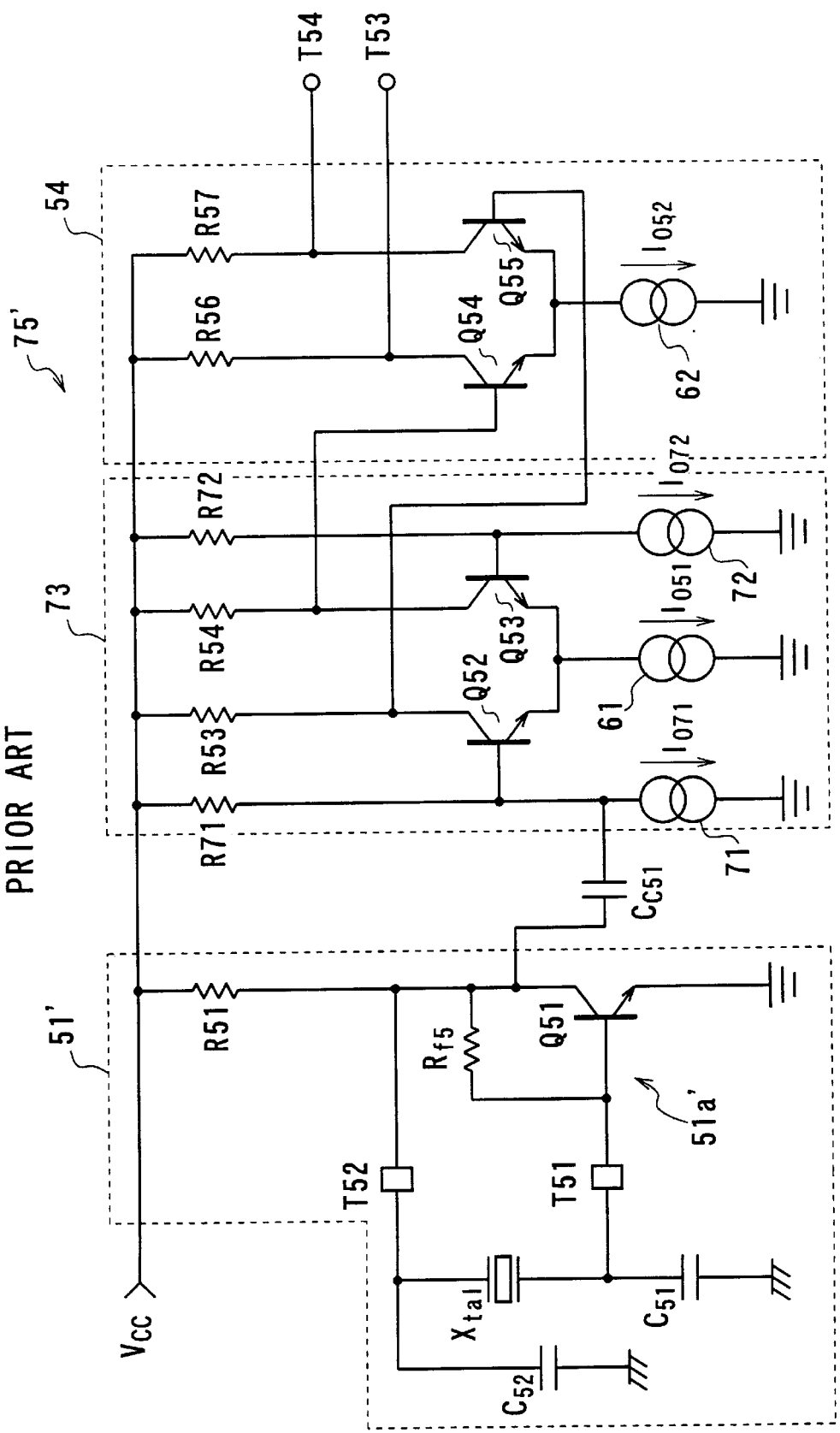
FIG. 4 is a circuit diagram showing a fourth example of the conventional oscillator circuits.

Preferred embodiments of the present invention will be described in detail below while referring to the drawings attached.

FIRST EMBODIMENT

Configuration

Figure 5:
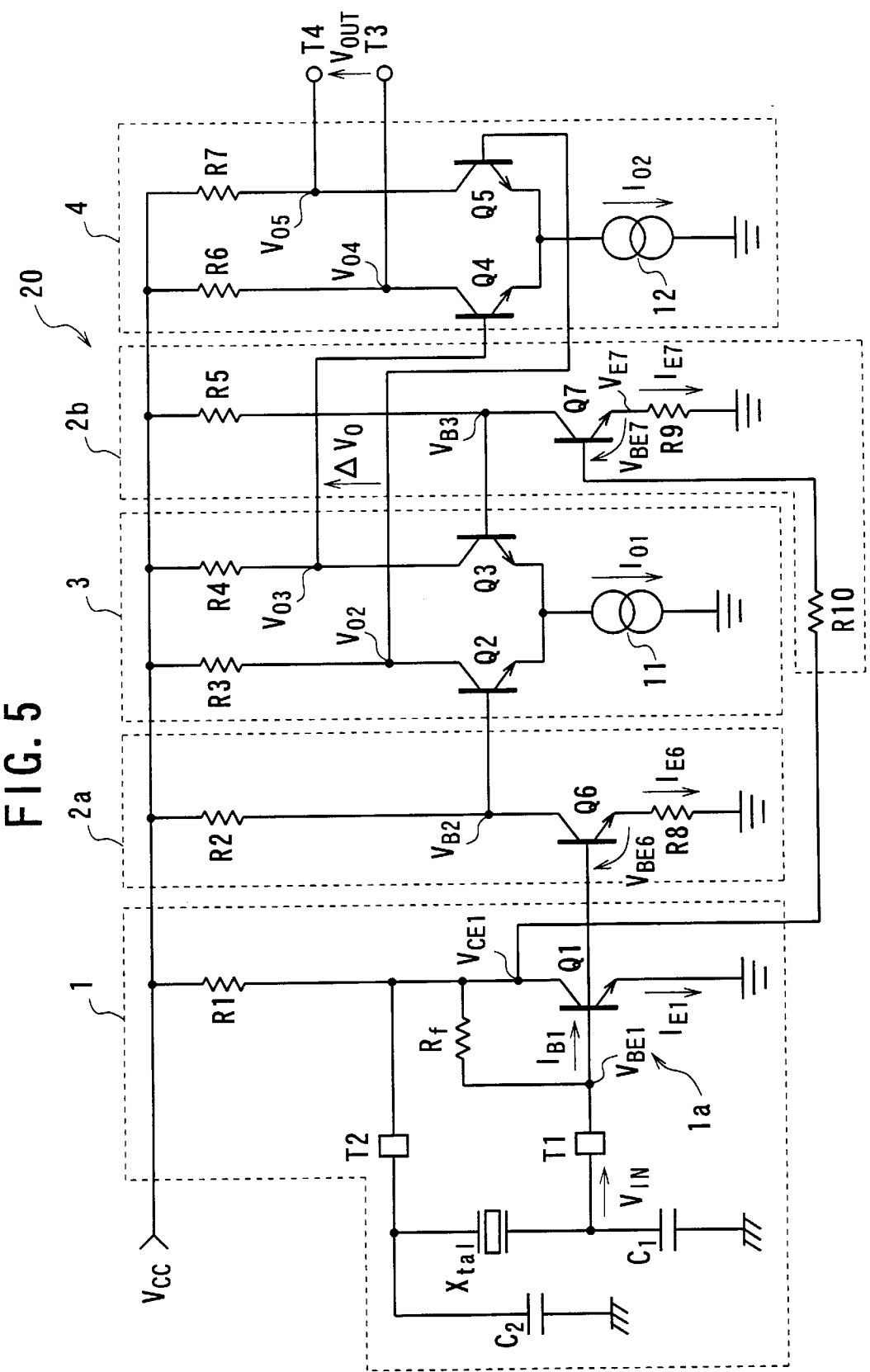
FIG. 5 is a circuit diagram showing an oscillator circuit according to a first embodiment of the present invention, in which an oscillation signal generated by a crystal oscillator is used as a repetitive signal.

As shown in FIG. 5, an oscillator circuit 20 according to a first embodiment of the present invention is comprised of a crystal oscillator 1, a first differential amplifier 3, a second differential amplifier 4, and first and second level converters 2a and 2b.

The crystal oscillator 1 includes a common-emitter amplifier 1a, a crystal $X_{tal}$, and two capacitors $C_1$ and $C_2$.

The common-emitter amplifier 1a has an npn-type bipolar transistor Q1, a feedback resistor $R_f$, and a load resistor R1. An emitter of the transistor Q1 is directly connected to the ground. A base of the transistor Q1 is directly connected to an input terminal T1. A collector of the transistor Q1 is connected through the load resistor R1 to a power supply line with a power supply voltage $V_{CC}$ applied thereto. The base and collector of the transistor Q1 are coupled together through the feedback resistor $R_f$. The collector of the transistor Q1 is directly connected to another input terminal T2.

A terminal of the crystal $X_{tal}$ is connected to the ground through the capacitor $C_1$. Another terminal of the crystal $X_{tal}$ is connected to the ground through the capacitor $C_2$. These two terminals of the crystal $X_{tal}$ are further connected to the input terminals T1 and T2, respectively. Thus, the two terminals of the crystal $X_{tal}$ are connected to the base and collector of the transistor Q1 through the input terminals T1 and T2, respectively.

The base of the transistor Q1 serves as an input terminal of the common-emitter amplifier 1a. The base and collector of the transistor Q1 serve as first and second output terminals of the common-emitter amplifier 1a.

The first level converter 2a has an npn-type bipolar transistor Q6, a load resistor R2, and an emitter resistor R8. A base of the transistor Q6 is directly connected to the base of the transistor Q1 (i.e., the first output terminal) of the common-emitter amplifier 1a. An emitter of the transistor Q6 is connected to the ground through the emitter resistor R8. A collector of the transistor Q6 is connected to the power supply line of $V_{CC}$ through the load resistor R2.

The base and collector of the transistor Q6 serve as input and output terminals of the first level converter 2a, respectively.

Similarly, the second level converter 2b has an npn-type bipolar transistor Q7, a load resistor R5, an emitter resistor R9, and an amplitude-adjusting resistor R10. A base of the transistor Q7 is connected to the collector of the transistor Q1 (i.e., the second output terminal) of the common-emitter amplifier 1a through the amplitude-adjusting resistor R10. An emitter of the transistor Q7 is connected to the ground through the emitter resistor R9. A collector of the transistor Q7 is connected to the power supply line of $V_{CC}$ through the load resistor R5.

The base and collector of the transistor Q7 serve as input and output terminals of the second level converter 2b, respectively.

The first differential amplifier 3, which serves as a buffer amplifier, has a pair of emitter-coupled npn-type bipolar transistors Q2 and Q3, a constant current sink 11 sinking a constant current $I_{O1}$ for driving the pair, and load resistors R3 and R4. The coupled emitters of the transistors Q2 and Q3 are connected to the ground through the constant current sink 11. A base of the transistor Q2 is connected to the collector of the transistor Q6 (i.e., the output terminal) of the first level converter 2a. A base of the transistor Q3 is connected to the collector of the transistor Q7 (i.e., the output terminal) of the second level converter 2b. The collectors of the transistors Q2 and Q3 are connected to the power supply line of $V_{CC}$ through the load resistors R3 and R4, respectively.

The bases of the transistors Q2 and Q3 serve as first and second input terminals of the first differential amplifier 3, respectively. The collectors of the transistors Q2 and Q3 serve as first and second output terminals of the amplifier 3, respectively.

The second differential amplifier 4, which serves as a normal amplifier, has a pair of emitter-coupled npn-type bipolar transistors Q4 and Q5, a constant current sink 12 sinking a constant current $I_{O2}$ for driving the pair, and load resistors R6 and R7. The coupled emitters of the transistors Q4 and Q5 are connected to the ground through the constant current sink 12. A base of the transistor Q4 is connected to the collector of the transistor Q3 (i.e., the second output terminal) of the first differential amplifier 3. A base of the transistor Q5 is connected to the collector of the transistor Q2 (i.e., the first output terminal) of the first differential amplifier 3. The collectors of the transistors Q4 and Q5 are connected to the power supply line of $V_{CC}$ through the load resistors R6 and R7, respectively. The collectors of the transistors Q4 and Q5 are further connected to output terminals T3 and T4, respectively.

The bases of the transistors Q4 and Q5 serve as first and second input terminals of the second differential amplifier 4, respectively. The collectors of the transistors Q4 and Q5 serve as first and second output terminals of the amplifier 4, respectively.

Here, the common-emitter amplifier 1a of the crystal oscillator 1, the first and second level converters 2a and 2b, and the first and second differential amplifiers 3 and 4 are formed on an IC (not shown) equipped with the input terminals T1 and T2 and the output terminals T3 and T4. The crystal $X_{tal}$ and its relating capacitors $C_1$ and $C_2$, which are produced as a unit, are located outside the IC and connected to the common-emitter amplifier 1a through the input terminals T1 and T2.

Operation

The operation of the oscillator circuit 20 according to the first embodiment shown in FIG. 5 is explained below.

The crystal oscillator 1, which includes the common-emitter amplifier 1a and the crystal $X_{tal}$, has a negative-feedback configuration using the feedback resistor $R_f$ and a self-biasing configuration.

A first output signal of the common-emitter amplifier 1a (i.e., the crystal oscillator 1), which has a fixed frequency $\omega$ defined by the crystal $X_{tal}$, is derived from the base of the transistor Q1 serving as the first output terminal of the oscillator 1.

A second output signal of the common-emitter amplifier 1a (i.e., the crystal oscillator 1), which has a same fixed frequency $\omega$ as the first output signal and an opposite phase thereto, is derived from the collector of the transistor Q1 serving as the second output terminal of the oscillator 1. Typically, the second output signal has an amplitude greater than that of the first output signal due to amplification behavior of the common-emitter amplifier 1a.

The operation of the oscillator 2 is known and therefore, no detailed explanation is provided here for the sake of simplification. For example, the operation of the oscillator 1 is substantially the same as that of a known oscillator circuit disclosed in Japan Journal of Electronic Information and Communication Institute, written by Saburo CHIBA, Vol. J73, C-II, No. 3, FIG. 1 on pp.143–153, March 1990. The only configuration difference in these two oscillators is that the emitter follower configuration in this known oscillator circuit is replaced with the common-emitter configuration, which is for the purpose of lowering the operable voltage.

The first output signal of the common-emitter amplifier 1a (i.e., the crystal oscillator 1) is applied to the base of the transistor Q6 of the first level converter 2a. The first level converter 2a converts the dc level of the first output signal of the common-emitter amplifier 1a and produces a first output signal at the collector of the transistor Q6. The first output signal thus produced is then applied to the base of the transistor Q2 (i.e., the first input terminal) of the first differential amplifier 3.

The second output signal of the common-emitter amplifier 1 (i.e., the crystal oscillator 1) is applied to the base of the transistor Q7 of the second level converter 2b through the amplitude-adjusting resistor R10. The second level converter 2b converts the dc level of the second output signal of the common-emitter amplifier 1 and produces a second output signal at the collector of the transistor Q7. The second output signal thus produced is then applied to the base of the transistor Q3 (i.e., the second input terminal) of the first differential amplifier 3.

Thus, the first and second output signals of the first and second level converters 2a and 2b are applied to the first and second input terminals of the first differential amplifier 3, respectively. In other words, the first and second output signals of the oscillator 1 are respectively applied to the first and second input terminals of the first differential amplifier 3 after equalizing the dc levels of the first and second output signals of the oscillator 1 to the dc levels at the first and second input terminals of the amplifier 3 (i.e., the bases of the transistors Q2 and Q3), respectively.

The first differential amplifier 3 amplifies the applied first and second output signals of the first and second level converters 2a and 2b and then, produces first and second output voltages $V_{C2}$ and $V_{C3}$ at the collectors of the transistors Q2 and Q3 (i.e., the first and second input terminals of the amplifier 3), respectively. Thus, a differential output voltage $\Delta V_o$ of the first differential amplifier 3, which is proportional to the difference between the applied first and second output signals of the common-emitter amplifier 1a, is produced between the collectors of the transistors Q2 and Q3.

The differential output voltage $\Delta V_o$ of the first differential amplifier 3 is directly applied across the bases of the transistors Q4 and Q5 (i.e., the first and second input terminals) of the second differential amplifier 4. The second differential amplifier 4 amplifies the applied differential output voltage $\Delta V_o$ and then, produces first and second output voltages $V_{O4}$ and $V_{O5}$ at the collectors of the transistors Q4 and Q5 (i.e., the first and second output terminals of the amplifier 4), respectively. Thus, a differential output voltage $\Delta V_{OUT}$ of the second differential amplifier 4, which is proportional to the differential output voltage $\Delta V_{OUT}$, is produced between the collectors of the transistors Q4 and Q5.

As described above, the first and second output voltages $V_{O4}$ and $V_{O5}$ of the oscillator circuit 20 according to the first embodiment in FIG. 5 are produced at the output terminals T3 and T4, respectively. In other words, the differential output voltage $\Delta V_{OUT}$ of the oscillator circuit 20 according to the first embodiment is outputted from the output terminals T3 and T4.

The first and second output voltages $V_{O4}$ and $V_{O5}$ and the differential output voltage $\Delta V_{OUT}$ have the same fixed frequency defined by the crystal $X_{tal}$.

With the oscillator circuit 20 according to the first embodiment shown in FIG. 5, the first output signal of the oscillator 1 (or, the common-emitter amplifier 1a), which is derived from the base of the transistor Q1, is applied to the first input terminal (i.e., the base of the transistor Q2) of the first differential amplifier 3 through the first level converter 2a while equalizing the dc level of the first output signal of the oscillator 1 (i.e., the dc level at the base of the transistor Q1) to the dc level at the base of the transistor Q2 of the first differential amplifier 3.

Similarly, the second output signal of the oscillator 1 (or, the common-emitter amplifier 1a), which is derived from the collector of the transistor Q1, is applied to the second input terminal (i.e., the base of the transistor Q3) of the first differential amplifier 3 through the second level converter 2b while equalizing the dc level of the second output signal of the oscillator 1 (i.e., the dc level at the collector of the transistor Q1) to the dc level at the base of the transistor Q3 of the first differential amplifier 3.

Thus, the oscillator 1 (or, the common-emitter amplifier 1a) is able to be interconnected with the first differential amplifier 3 through the first and second level converters 2a and 2b without any coupling capacitor.

Therefore, when the oscillator circuit 20 according to the first embodiment is formed on an IC, this amplifier circuit 20 does not occupy a large chip size of the IC. As a result, the fabrication cost of the IC is decreased.

Further, due to absence of the coupling capacitor, the frequency of inspection tests and the operable frequency of the oscillator circuit 20 are not restricted by the coupling capacitor. Accordingly, the inspection tests can be carried out at a frequency lower than the operating frequency of the oscillator circuit 20 and at the same time, the operable frequency range can be expanded.

Dc-Level Conversion

The dc-level conversion of the first and second level converters 2a and 2b are carried out in the following way.

In the first level converter 2a, an emitter current $I_{E6}$ of the transistor Q6 flows through the load resistor R2 and the emitter resistor R8, thereby generating a voltage drop of $(I_{E6} \cdot R_2)$, where $R_2$ denotes the resistance of the load resistor R2. Therefore, the dc level (i.e., the dc bias voltage $V_{E2}$) at the collector of the transistor Q6 is equal to $[V_{CC}-(I_{E6} \cdot R_2)]$ with respect to the ground.

Thus, the dc level or dc bias voltage $V_{E2}$ at the collector of the transistor Q6 is defined by the emitter current $I_{E6}$ and the resistance $R_2$ of the load resistor R2.

Similarly, in the second level converter 2b, an emitter current $I_{E7}$ of the transistor Q7 flows through the load resistor R5 and the emitter resistor R9, thereby generating a voltage drop of $(I_{E7} \cdot R_5)$, where $R_5$ denotes the resistance of the load resistor R5. Therefore, the dc level (i.e., the dc bias voltage $V_{B3}$) at the collector of the transistor Q7 is equal to $[V_{CC}-(I_{E7} \cdot R_5)]$ with respect to the ground.

Thus, the dc level or dc bias voltage $V_{B3}$ at the collector of the transistor $Q^7$ is defined by the emitter current $I_{E7}$ and the resistance $R_5$ of the load resistor R5.

As described above, if the specific circuit parameters of the first and second level converters 2a and 2b are suitably adjusted, the dc levels (or, components) or bias voltages $V_{B2}$ and $V_{B3}$ at the bases of the transistors Q2 and Q3 are able to become equal to the dc bias voltage for the first differential amplifier 3. Accordingly, no problem will occur due to the bias or dc level difference between the first differential amplifier 3 and the oscillator 1.

On the other hand, the ac components (i.e., signal components) of the first and second output signals of the oscillator 1, which have opposite phases, are differentially applied across the bases of the transistors Q2 and Q3 of the first differential amplifier 3 through the first and second level converters 2a and 2b, respectively. Consequently, the ac or signal components of the first and second output signals of the oscillator 1 are transmitted to the first differential amplifier 3 without a problem.

Because of the reason as above, the oscillator circuit 1 is interconnected with the first differential amplifier 3 even if no coupling capacitor is used.

Determination Method of $I_{E6}$

Next, the method of determining the emitter current $I_{E6}$ of the transistor Q6 of the first level converter 2a is explained below.

In the common-emitter amplifier 1a of the oscillator 1, a base-to-emitter voltage $V_{BE1}$ of the transistor Q1 is determined according to its emitter current $I_{E1}$. Since the emitter of the transistor Q1 is directly connected to the ground, the voltage at the base of the transistor Q1 with respect to the ground is equal to $V_{BE1}$. On the other hand, since the base of the transistor Q1 is directly connected to the base of the transistor Q6 of the first level converter 2a, the base voltage of the transistor Q6 with respect to the ground is also equal to $V_{BE1}$. Thus, the transistor Q6 is driven by the voltage of $V_{BE1}$.

If a base-to-emitter voltage of the transistor Q6 is defied as $V_{BE6}$, the base-to-emitter voltage $V_{BE1}$ of the transistor Q1 is given by the following equation (1), where $R_8$ is the resistance of the emitter resistor R8.

$$V_{BE1} = V_{BE6} + (R_8 I_{E6}) \tag{1}$$

On the other hand, the emitter current $I_{E1}$ of the transistor Q1 is expressed as follows, where R1 is the resistance of the load resistor R1.

$$I_{E1} = \frac{V_{CC} - V_{BE1}}{R_1} \tag{2}$$

In general, the following well-known relationship (3) is established between the emitter current $I_{E1}$ of the transistor Q1 and the base-to-emitter voltage $V_{BE1}$ thereof.

$$I_{E1} = I_S \exp\left(\frac{qV_{BE1}}{kT}\right) \tag{3}$$

In the relationship (3), $I_S$ is the saturation current of a bipolar transistor, k is the Boltzmann's constant, T is absolute temperature in degrees Kelvin, and q is the charge of an electron.

Similarly, the following relationship (4) is generally established between the emitter current $I_{E6}$ of the transistor Q6 and the base-to-emitter voltage $V_{BE6}$ thereof.

$$I_{E6} = I_S \exp\left(\frac{qV_{BE6}}{kT}\right) \tag{4}$$

The following equation (5a) is obtained by substituting the above equation (1) into the above equation (3).

$$I_{E1} = I_S \exp\left(\frac{qV_{BE6}}{kT}\right) \exp\left(\frac{qI_{E6}R_8}{kT}\right) \tag{5a}$$

The following equation (5b) is obtained by substituting the above equation (4) into the equation (5a).

$$I_{E1} = I_{E6} \exp\left(\frac{qI_{E6}R_8}{kT}\right) \tag{5b}$$

Therefore, the ratio of the emitter currents $I_{E1}$ and $I_{E6}$ is expressed as the following equation (6a) using the above equations (4) and (5b).

$$\frac{I_{E1}}{I_{E6}} = \exp\left(\frac{q}{kT} I_{E6} R_8\right) \tag{6a}$$

The equation (6a) is rewritten to the following equation (6b).

$$\ln\left(\frac{I_{E1}}{I_{E6}}\right) = \left(\frac{q}{kT} I_{E6} R_8\right) \tag{6b}$$

From the equation (6b), the resistance $R_8$ of the resistor R8 is given by the following equation (6c).

$$R_8 = \left(\frac{kT}{qI_{E6}}\right) \ln\left(\frac{I_{E1}}{I_{E6}}\right) \tag{6c}$$

As seen from the equation (6c), if the ratio of the emitter currents $I_{E1}$ and $I_{E6}$, i.e., ($I_{E1}/I_{E6}$) are set as a specific value in advance, the emitter current $I_{E6}$ is determined by adjusting the resistance $R_8$ of the emitter resistor R8 of the transistor Q6.

The operation of the transistors Q6 and Q1 is same as that of the well-known Widlar current source circuit, which is disclosed in, for example, the book entitled "Design Techniques of Semiconductor Circuits", published by Nikkei McGraw-Hill Publishing Co. Ltd., pp. 247–250.

Using the emitter current $I_{E6}$ thus determined, the dc level or bias voltage $V_{B2}$ at the base of the transistor Q2 with respect to the ground is given as the following expression (7), where $R_2$ is the resistance of the load resistor R2.

$$V_{B2} = V_{CC} - (I_{E6} R_2) \tag{7}$$

Determination Method of $I_{E7}$

Subsequently, the method of determining the emitter current $I_{E7}$ of the transistor Q7 is explained below.

If a base-to-emitter voltage of the transistor Q7, an emitter voltage of the transistor Q7 with respect to the ground, and a collector-to-emitter voltage of the transistor Q1 with respect to the ground are defined as $V_{BE7}$, $V_{E7}$, and $V_{CB1}$, respectively, the emitter current $I_{E7}$ is expressed as the following equation (8a), where $R_9$ is the resistance of the load resistor R9.

$$I_{E7} = \frac{V_{CE1} - V_{BE7}}{R_9} = \frac{V_{E7}}{R_9} \tag{8a}$$

In the equation (8a), the collector-to-emitter voltage $V_{CE1}$ of the transistor Q1 is given by the following equation (8b), where $I_{B1}$ is a base current of the transistor Q1.

$$V_{CE1} = V_{BE1} + (I_{B1} R_f) \tag{8b}$$

Accordingly, using the emitter current $I_{E7}$ thus determined by the equations (8a) and (8b), the dc level or bias voltage $V_{B3}$ at the base of the transistor Q3 is given by the following equation (9), where $R_5$ is the resistance of the load resistor R5.

$$V_{B3} = V_{CC} - (I_{E7} R_5) \qquad (9)$$

Through the above-explained methods, the emitter currents $I_{E6}$ and $I_{E7}$ of the transistors Q6 and Q7 of the first and second level converters 2a and 2b are determined. Accordingly, the dc levels or bias voltages $V_{B2}$ and $V_{B3}$ at the bases of the transistors Q2 and Q3 of the first differential amplifier 3 are able to be determined so as to interconnect the oscillator 1 with the first differential amplifier 3 without using any coupling capacitor.

For example, if the emitter currents $I_{E6}$ and $I_{E7}$ are equal and the resistances $R_2$ and $R_5$ of the load resistors R2 and R5 are equal, the dc levels $V_{B2}$ and $V_{B3}$ at the bases of the transistors Q2 and Q3 will be equal and therefore, the first differential amplifier 3 operates normally. In this case, the first-stage oscillator 1 is duly interconnected with the second-stage first differential amplifier 3 without using any coupling capacitor.

Amplitude Adjustment of Signal Components

Further, the amplitude of the ac or signal components of the first and second output signals of the oscillator 1 is explained below.

As known well, the first and second output signals of the oscillator 1, which are respectively derived from the base and collector of the transistor Q1, have the same frequency ω defined by the crystal $X_{tal}$ and opposite phases. Also, when the gain of the common-emitter amplifier 1 is defined as G, the amplitude of the second output signal is G times as large as that of the first output signal, where G is greater than unity. Therefore, if the first and second output signals are directly applied across the bases of the transistors Q2 and Q3 of the first differential amplifier 3 through dc-level conversion by the first and second level converters 2a and 2b, the differential output signal of the amplifier 3 will include large distortion.

However, in the oscillator circuit 20 according to the first embodiment shown in FIG. 5, the amplitude of the second output signal is readily decreased so as to be equal to the amplitude of the first output signal using the amplitude-adjusting resistor R10.

Accordingly, the first and second output signals having the equal amplitudes and opposite phases are applied across the first and second input terminals of the first differential amplifier 3. Thus, the first differential amplifier 3 operates normally as in the conventional oscillator circuit 55 in FIG. 1.

Since the first and second output signals of the oscillator 1 are differentially applied across the first differential amplifier 3, the amplitude of the differential output signal $\Delta V_o$ of the amplifier 3 is equal to twice as large as that of the conventional circuit 55 shown in FIG. 1.

SECOND EMBODIMENT

Figure 6:
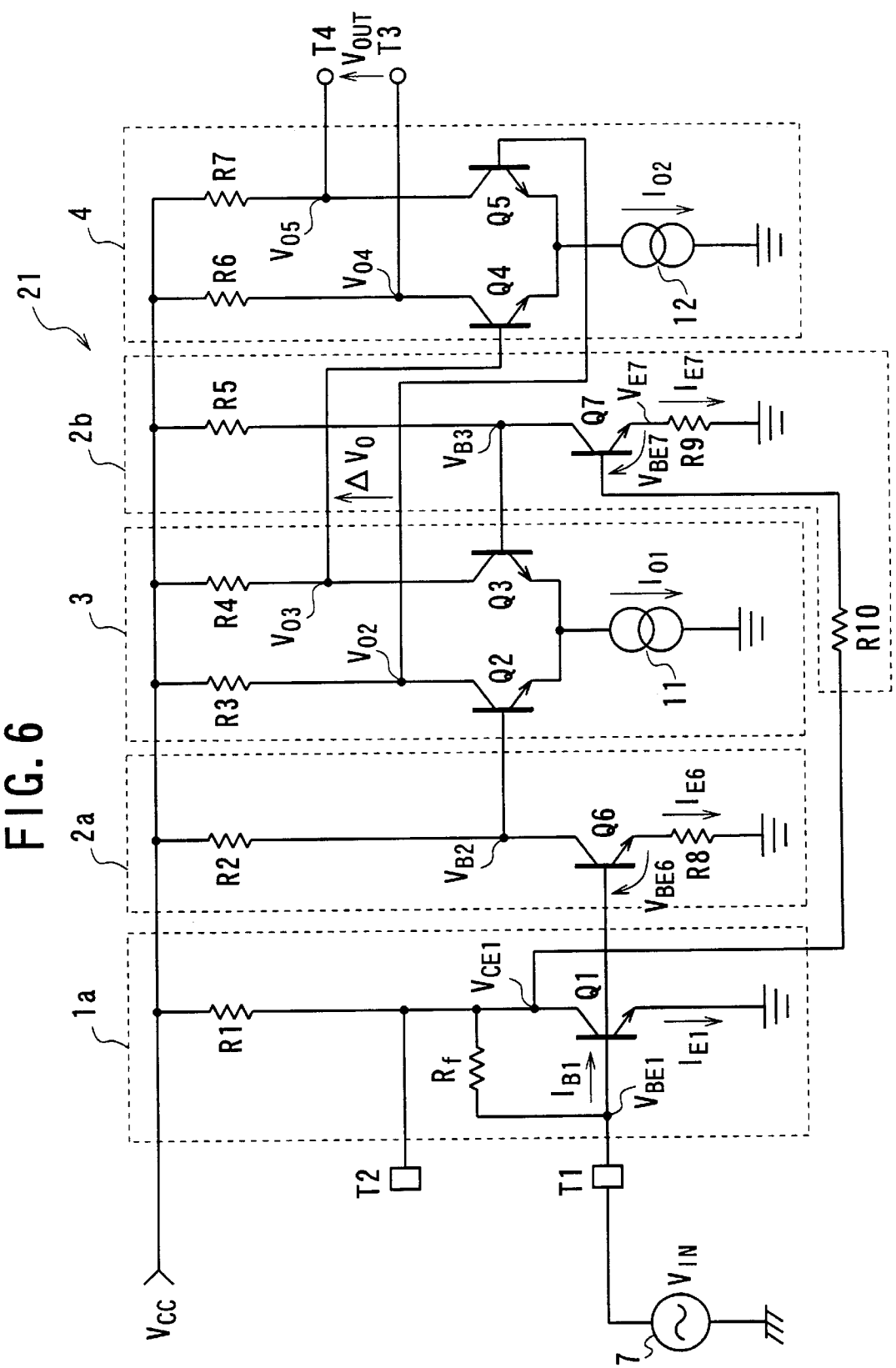
FIG. 6 is a circuit diagram showing an amplifier circuit according to a second embodiment of the present invention, to which a clock signal generated by an external clock generator is applied.

FIG. 6 shows an amplifier circuit according to a second embodiment of the present invention. This amplifier circuit 21 has the same configuration as that of the oscillator circuit 20 according to the first embodiment in FIG. 5 except that the crystal $X_{tal}$ and the capacitors $C_1$ and $C_2$ are removed. In other words, the amplifier circuit 21 is comprised of the common-emitter amplifier 1a, the first and second differential amplifiers 3 and 4, and the first and second level converters 2a and 2b.

Therefore, explanation about the circuit configuration is omitted here by attaching the same reference symbols as those in the first embodiment to the same elements in FIG. 6 for the sake of simplification.

As an input signal of the amplifier circuit 21 according to the second embodiment, a clock signal $V_{IN}$ generated by an external clock generator 7 is applied to the common-emitter amplifier 1a through the input terminal T1. The input terminal T2 is not used.

In the amplifier circuit 21, the first output signal of the common-emitter amplifier 1a is equal to the input signal $V_{IN}$. The second output signal of the amplifier 1a is G times as large as that of the input signal $V_{IN}$ and the first output signal of the common-emitter amplifier 1a.

There is substantially the same advantages as those in the oscillator circuit 20 according to the first embodiment shown in FIG. 5.

Specifically, the common-emitter amplifier 1a is able to be interconnected with the first differential amplifier 3 through the first and second level converters 2a and 2b without any coupling capacitor. Therefore, when the amplifier circuit 21 according to the second embodiment is formed on an IC, this amplifier circuit 21 does not occupy a large chip size of the IC. As a result, the fabrication cost of the IC is decreased.

Further, due to absence of the coupling capacitor, the frequency of inspection tests and the operable frequency of the amplifier circuit 21 are not restricted by the coupling capacitor. Accordingly, the inspection tests can be carried out at a frequency lower than the operating frequency of the amplifier circuit 21 and at the same time, the operable frequency range can be expanded.

THIRD EMBODIMENT

Figure 7:
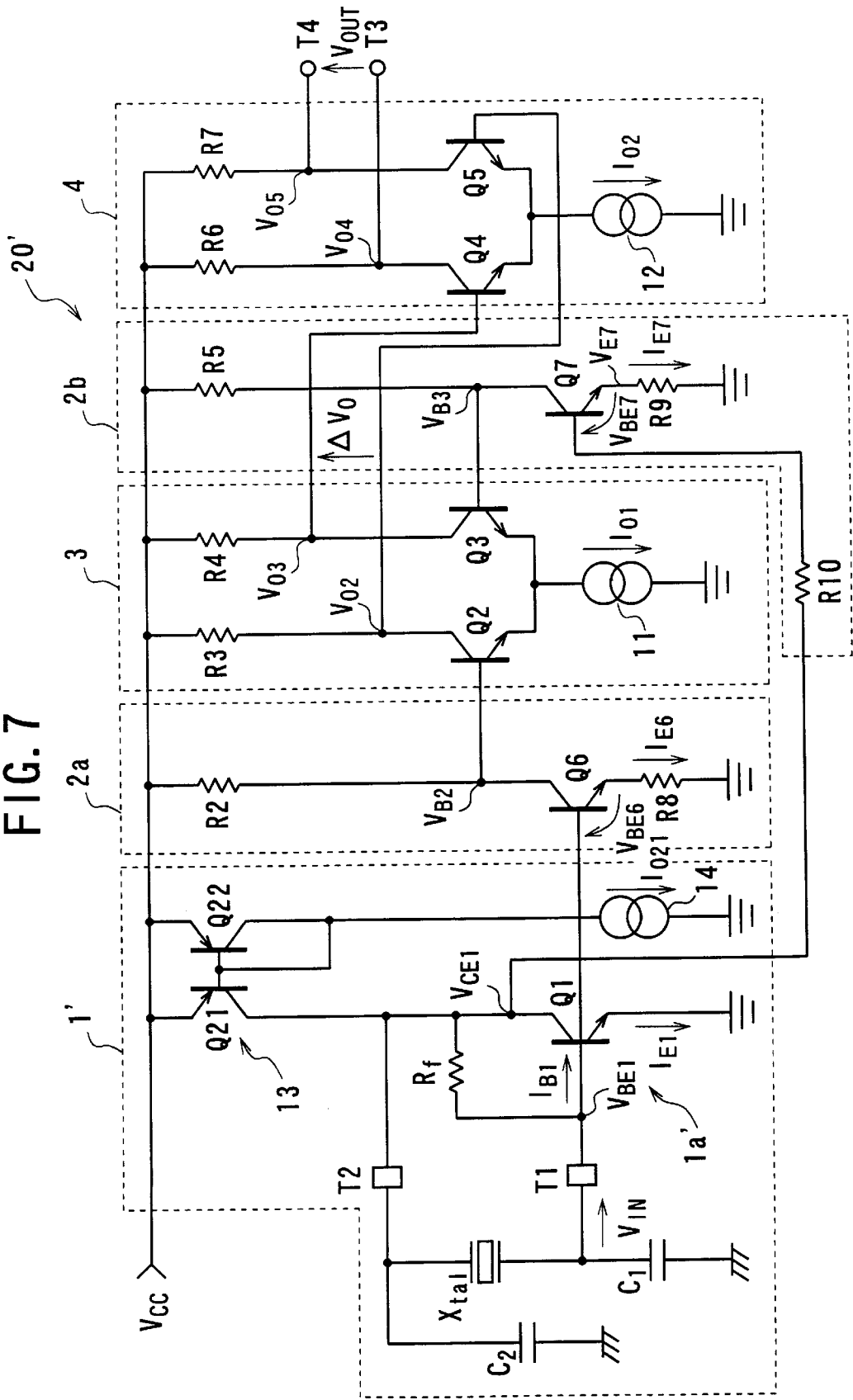
FIG. 7 is a circuit diagram showing an oscillator circuit according to a third embodiment of the present invention, in which an oscillation signal generated by a crystal oscillator is used as a repetitive signal.

FIG. 7 shows an oscillator circuit according to a third embodiment of the present invention. This oscillator circuit 20' has the same configuration as that of the oscillator circuit 20 according to the first embodiment in FIG. 5 except that an oscillator 1' is provided instead of the oscillator 1.

In the oscillator 1', a common-emitter amplifier 1a' is provided instead of the common-emitter amplifier 1a.

The common-emitter amplifier 1a' has the same configuration as that of the common-emitter amplifier 1a shown in FIG. 5 except that the load resistor R1 is replaced with the combination of a current mirror 13 formed by base-coupled pnp-type bipolar transistors Q21 and Q22 and a constant current sink 14 sinking a constant current $I_{C21}$ serving as an active load.

As shown in FIG. 7, emitters of the transistors Q21 and Q22 are coupled together to be connected to the power supply line of $V_{CC}$. A collector of the transistor Q21 is connected to the collector of the transistor Q1 and the input terminal T2. A collector of the transistor Q22, which is coupled with the base of the transistor Q22, is connected to the ground through the constant current sink 14.

There is the same advantages as those in the oscillator circuit 20 according to the first embodiment.

FOURTH EMBODIMENT

Figure 8:
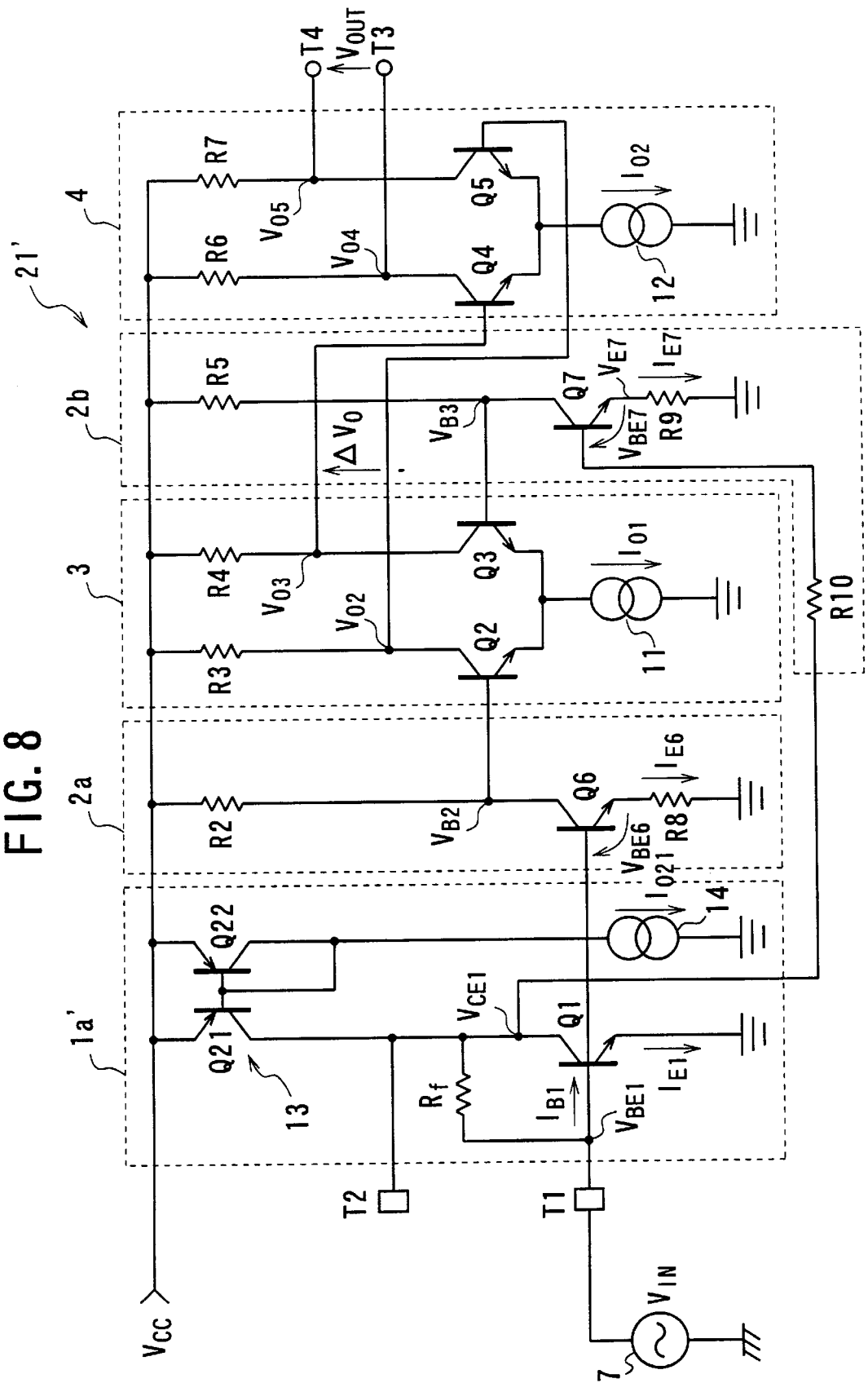
FIG. 8 is a circuit diagram showing an amplifier circuit according to a fourth embodiment of the present invention, to which a clock signal generated by an external clock generator is applied.

FIG. 8 shows an amplifier circuit according to a fourth embodiment of the present invention. This amplifier circuit 21' has the same configuration as that of the amplifier circuit 21 according to the second embodiment in FIG. 6 except that a common-emitter amplifier 1a' is provided instead of the common-emitter amplifier 1a.

The configuration of the common-emitter amplifier 1a' is explained in the oscillator circuit 20' according to the third embodiment.

There is the same advantages as those in the amplifier circuit 21 according to the second embodiment.

APPLICATION EXAMPLE

Figure 9:
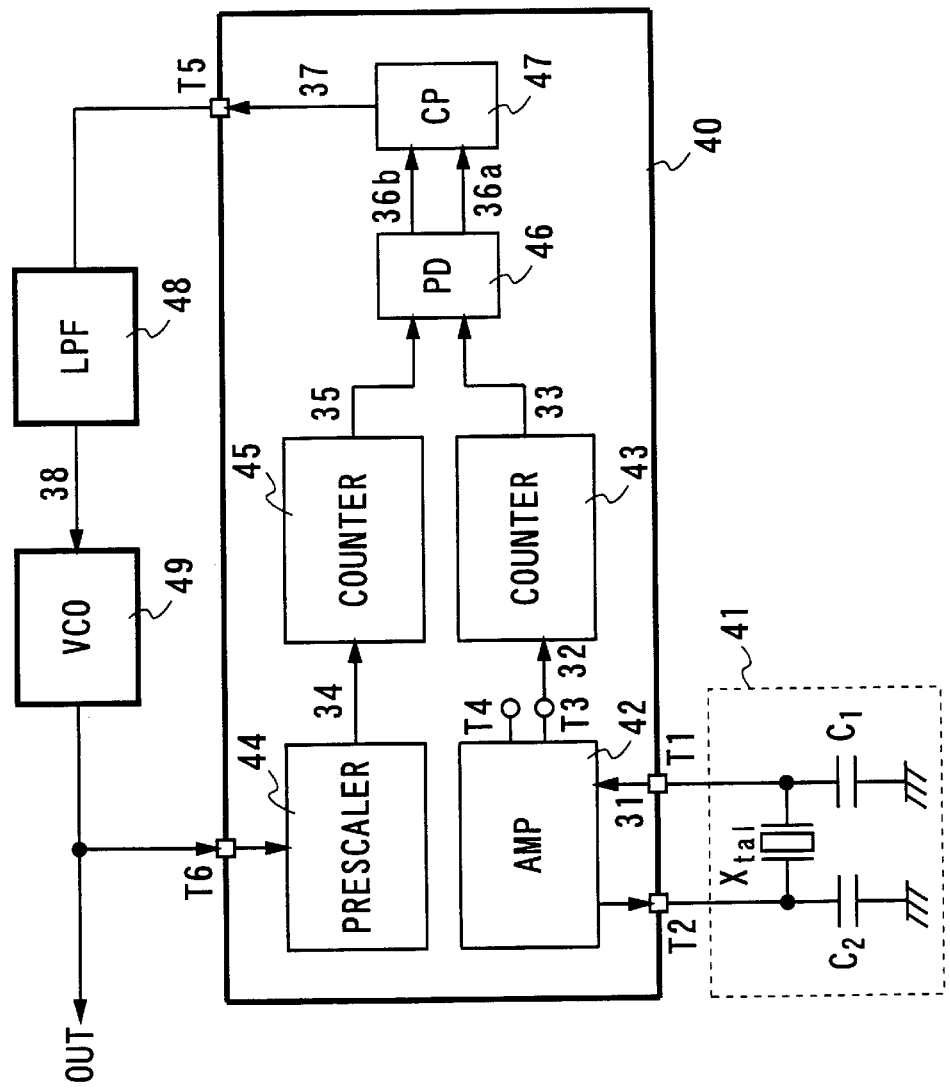
FIG. 9 is a block diagram showing a frequency synthesizer including a PLL circuit, in which the amplifier circuit according to the second or fourth embodiment of the present invention is used to amplify the oscillation signal generated by a crystal oscillator.

FIG. 9 shows the circuit configuration of a frequency synthesizer applicable to the mobile communication systems, in which the amplifier circuit 21 according to the second embodiment in FIG. 6 is used as an amplifier 42. This is an application example of the present invention.

As shown in FIG. 9, the amplifier 42 is applied with an output signal 31 of a crystal element 41 as a reference signal with a reference frequency through the input terminal T1. The crystal element 41 includes a crystal $X_{tal}$, and two capacitors $C_1$ and $C_2$, which is the same configuration as shown in the oscillators 1 and 1' of the oscillator circuits 20 and 20' according to the first and third embodiments.

The amplifier 42 amplifies the reference signal 31 from the crystal element 41 and outputs a pair of opposite-phase amplified reference signals 32 to the output terminals T3 and T4, respectively. Here, only the output terminal T3 is used for outputting one of the amplified reference signals 32.

A counter 43 receives the amplified reference signal 32 from the amplifier 42 through the output terminal T3. The counter 43 serves as a frequency-divider or frequency-demultiplier for frequency-dividing or frequency-demultiplying the amplified reference signal 32, thereby outputting a frequency-divided reference signal 33 to a phase detector 46.

On the other hand, a prescaler 44 receives an fedback output signal OUT of the frequency synthesizer through a feedback terminal T6 and outputs a prescaled output signal 34 to a counter 45.

The counter 45 also serves as a frequency-divider or frequency-demultiplier for frequency-dividing or frequency-demultiplying the prescaled output signal 34 of the prescaler 44, thereby outputting a frequency-divided output signal 35 to the phase detector 46.

The phase detector 46 detects the phase difference between the frequency-divided reference signal 33 and the frequency-divided output signal 35. Then, the phase detector 46 outputs one of phase-difference signals 36a and 36b to a charge pump 47 according to the polarity (i.e., advance or delay) of the phase difference thus detected.

The charge pump 47 receives the phase-difference signal 36a or 36b from the phase detector 46 and outputs a pulsed phase-difference signal 37 to an output terminal T5 according to the phase difference detected by the phase detector 46.

A low-pass filter 48 receives the pulsed phase-difference signal 37 through the output terminal T5 and integrates the same, thereby outputting a control signal 38. The control signal 38 is a variable voltage signal according to the phase difference between the frequency-divided reference signal 33 and the frequency-divided output signal 35.

A voltage-controlled oscillator 49 receives the control signal 38 from the low-pass filter 48 and outputs the output signal OUT according to the voltage of the control signal 38. Specifically, the voltage-controlled oscillator 49 changes the frequency of the output signal OUT to reduce the phase difference between the frequency-divided reference signal 33 and the frequency-divided output signal 35 by means of the control signal 38, thereby causing the phase difference to be zero.

Thus, the output signal OUT of the frequency synthesizer is locked at a frequency proportional to the reference frequency of the reference signal 31 through the well-known circuit function of the Phase-Locked Loop (PLL).

In FIG. 9, the amplifier 42, the counters 43 and 45, the prescaler 44, the phase detector 46, and the charge pump 47 are formed on an IC 40 having the terminals T1, T2, T5, and T6. The crystal oscillator element 41 is located outside the IC 40.

The frequency synthesizer shown in FIG. 9 is an application example of the present invention and therefore, the present invention may be any other applications.

It is needless to say that the amplifier circuit 21' according to the fourth embodiment in FIG. 8 may be used as the amplifier 42 in FIG. 9. Also, instead of the combination of the crystal element 41 and the amplifier 42 in FIG. 9, the oscillator circuit 20 or 20' according to the first or third embodiment shown in FIG. 5 or 7 may be used.

Although bipolar transistors are used for the first and second differential amplifiers 3 and 4 in the first to fourth embodiments, it is clear that MOSFETs may be used for these amplifiers 3 and 4 instead of the bipolar transistors.

While the preferred forms of the present invention have been described, it is to be understood that modifications will be apparent to those skilled in the art without departing from the spirit of the invention. The scope of the invention, therefore, is to be determined solely by the following claims

What is claimed is:

1. An amplifier circuit comprising:
   (a) a common-emitter amplifier including a single first bipolar transistor;
      an input signal being applied to a base of said first bipolar transistor, thereby producing a first and a second output signal;
      said first output signal of said common-emitter amplifier being derived from said base of said first bipolar transistor;
      said second output signal of said common-emitter amplifier being derived from a collector of said first bipolar transistor;
   (b) a first level converter for converting a dc level of said first output signal of said common-emitter amplifier to a first dc level;
   (c) a second level converter for converting a dc level of said second output signal of said common-emitter amplifier to a second dc level; and
   (d) a differential amplifier including a first and a second input terminal and a first and a second output terminal;
      a dc level at said first input terminal of said differential amplifier being equal to said first dc level;
      a dc level of said second input terminal of said differential amplifier being equal to said second dc level;
      wherein said first output signal of said common-emitter amplifier is applied to said first input terminal of said differential amplifier through said first level converter, thereby producing a first output signal of said differential amplifier at said first output terminal;
      and wherein said second output signal of said common-emitter amplifier is applied to said second input terminal of said differential amplifier through said second level converter, thereby producing a second output signal of said differential amplifier at said second output terminal.

2. The amplifier as claimed in claim 1, wherein said first bipolar transistor has a feedback resistor connected to said base and said collector of said first bipolar transistor, thereby forming a self-biasing configuration;

and wherein a current flowing through said first bipolar transistor and a current flowing through said first level converter have a relationship approximately equal to a relationship between a reference current and an output current in the Widlar current source circuit.

3. The amplifier as claimed in claim 1, wherein said second level converter has a second bipolar transistor;

and wherein a current flowing through said second bipolar transistor is dependent upon a difference between said dc level of said second output signal of said common-emitter amplifier and a base-to-emitter voltage of said second transistor.

4. The amplifier as claimed in claim 1, wherein said common-emitter amplifier includes a constant current source/sink connected to said collector of said first transistor as an active load.

5. The amplifier as claimed in claim 1, wherein said second level converter has a resistor for adjusting an amplitude difference between said first and second output signals of said common-emitter amplifier.

6. The amplifier as claimed in claim 1, wherein said first level converter includes a second bipolar transistor and a first load resistor and a first emitter resistor, and said second level converter includes a third bipolar transistor and a second load resistor and a second emitter resistor;

and wherein said first load resistor is connected to a collector of said second bipolar transistor and said first emitter resistor is connected to an emitter of said second bipolar transistor; a base of said second bipolar transistor being connected to said base of said first bipolar transistor of said common-emitter amplifier;

and wherein said second load resistor is connected to a collector of said third bipolar transistor and said second emitter resistor is connected to an emitter of said third bipolar transistor; a collector of said third bipolar transistor being connected to said collector of said first bipolar transistor of said common-emitter amplifier.

7. The amplifier as claimed in claim 6, wherein said collector of said first bipolar transistor is connected to said base of said third transistor through a resistor for adjusting an amplitude difference between said first and second output signals of said common-emitter amplifier.

8. The amplifier as claimed in claim 1, wherein a repetitive signal is applied to said base of said first bipolar transistor as said input signal;

whereby said amplifier serves as an oscillator circuit.

9. An oscillator circuit comprising:

(a) an oscillator for generating a first repetitive signal with an oscillation frequency and a second repetitive signal with a same oscillation frequency as said first repetitive signal;

said oscillator including a common-emitter amplifier having single a single first bipolar transistor;

said first repetitive signal of said oscillator being derived from a base of said first bipolar transistor;

said second repetitive signal of said oscillator being derived from a collector of said first bipolar transistor;

(b) a first level converter for converting a dc level of said first repetitive signal of said oscillator to a first dc level;

(c) a second level converter for converting a dc level of said second repetitive signal of said oscillator to a second dc level; and (d) a differential amplifier including first and second input terminals and first and second output terminals;

a dc level at said first input terminal of said differential amplifier being equal to said first dc level;

a dc level of said second input terminal of said differential amplifier being equal to said second dc level;

wherein said first repetitive signal of said oscillator is applied to said first input terminal of said differential amplifier through said first level converter, thereby producing a first output signal of said differential amplifier at said first output terminal;

and wherein said second repetitive signal of said oscillator is applied to said second input terminal of said differential amplifier through said second level converter, thereby producing a second output signal of said differential amplifier at said second output terminal.

10. The oscillator circuit as claimed in claim 9, wherein said first bipolar transistor has a feedback resistor connected to said base and said collector of said first bipolar transistor, thereby forming a self-biasing configuration;

and wherein a current flowing through said first bipolar transistor and a current flowing through said first level converter have a relationship approximately equal to a relationship between a reference current and an output current in the Widlar current source circuit.

11. The oscillator circuit as claimed in claim 9, wherein said second level converter has a second bipolar transistor;

and wherein a current flowing through said second bipolar transistor is dependent upon a difference between said dc level of said second output signal of said common-emitter amplifier and a base-to-emitter voltage of said second transistor.

12. The oscillator circuit as claimed in claim 9, wherein said common-emitter amplifier of said oscillator includes a constant current source/sink connected to said collector of said first transistor as an active load.

13. The oscillator circuit as claimed in claim 9, wherein said second level converter has a resistor for adjusting an amplitude difference between said first and second output signals of said common-emitter amplifier of said oscillator.

14. The oscillator circuit as claimed in claim 9, wherein said first level converter includes a second bipolar transistor and a first load resistor and a first emitter resistor, and said second level converter includes a third bipolar transistor and a second load resistor and a second emitter resistor;

and wherein said first load resistor is connected to a collector of said second bipolar transistor and said first emitter resistor is connected to an emitter of said second bipolar transistor; a base of said second bipolar transistor being connected to said base of said first bipolar transistor of said common-emitter amplifier;

and wherein said second load resistor is connected to a collector of said third bipolar transistor and said second emitter resistor is connected to an emitter of said third bipolar transistor; a collector of said third bipolar transistor being connected to said collector of said first bipolar transistor of said common-emitter amplifier.

15. The oscillator circuit as claimed in claim 14, wherein said collector of said first bipolar transistor is connected to said base of said third transistor through a resistor for adjusting an amplitude difference between said first and second output signals of said common-emitter amplifier.

16. The oscillator circuit as claimed in claim 9, wherein said oscillator is a crystal oscillator.

* * * * *

UNITED STATES PATENT AND TRADEMARK OFFICE
CERTIFICATE OF CORRECTION

PATENT : 6,046,639
DATED : April 04, 2000
INVENTOR(S) : Hiroshi KUDO

It is certified that error appears in the above-identified patent and that said Letters Patent is hereby corrected as shown below:

Column 10, line 55 delete "2", insert --1--

Column 11, line 31 delete "$V_{c2}$ and $V_{c3}$, insert --$V_{0z}$ and $V_{03}$--;

line 62 after "frequency" insert--w--

Column 16, line 51 delete "$I_{c21}$", insert --$I_{021}$--

Signed and Sealed this

Twentieth Day of March, 2001

*Attest:*

NICHOLAS P. GODICI

*Attesting Officer*     Acting Director of the United States Patent and Trademark Office